(12) United States Patent
Bratkovski et al.

(10) Patent No.: US 7,863,625 B2
(45) Date of Patent: Jan. 4, 2011

(54) NANOWIRE-BASED LIGHT-EMITTING DIODES AND LIGHT-DETECTION DEVICES WITH NANOCRYSTALLINE OUTER SURFACE

(75) Inventors: Alexandre Bratkovski, Mountain View, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/242,559

(22) Filed: Sep. 30, 2008

(65) Prior Publication Data

US 2010/0019252 A1    Jan. 28, 2010

Related U.S. Application Data

(60) Provisional application No. 61/137,045, filed on Jul. 24, 2008.

(51) Int. Cl.
*H01L 29/26* (2006.01)
(52) U.S. Cl. .......... 257/80; 257/414; 257/E33.006; 438/22; 438/48; 977/932
(58) Field of Classification Search ............ None
See application file for complete search history.

(56) References Cited

U.S. PATENT DOCUMENTS

| 7,254,151 | B2 | 8/2007 | Lieber et al. |
| 2006/0175601 | A1 | 8/2006 | Lieber et al. |
| 2007/0107103 | A1* | 5/2007 | Kempa et al. ............ 977/834 |
| 2008/0081388 | A1* | 4/2008 | Yasseri et al. ............ 438/22 |
| 2008/0149944 | A1* | 6/2008 | Samuelson et al. ......... 257/88 |

OTHER PUBLICATIONS

Tian et al, Coaxial silicon nanowires as solar cells and nanoelectronic power sources, Oct. 18, 2007, Nature 449, 885-889.*
Talapin et al, Synthesis of Colloidal PbSe/PbS Core-Shell Nanowires and PbS/Au Nanowire-Nanocrystal Heterostructures, Sep. 5, 2007, J. Phys. Chem. C, vol. 111, pp. 14049-14054.*

* cited by examiner

*Primary Examiner*—Evan Pert
*Assistant Examiner*—Andres Munoz

(57) ABSTRACT

Embodiments of the present invention are directed to nanowire (100) devices having concentric and coaxial doped regions and nanocrystals (108,110) disposed on the outer surfaces. In certain embodiments, the nanowire devices can include a light-emitting region (120) and be operated as a light-emitting diode ("LED") (200), while in other embodiments, the nanowire devices can be operated as a light-detection device (600). The nanocrystals (108,110) disposed on the outer surfaces provide electron-conduction paths and include spaces that allow light to penetrate and be emitted from nanowire regions.

15 Claims, 9 Drawing Sheets

NANOWIRE-BASED LIGHT-EMITTING DIODES AND LIGHT-DETECTION DEVICES WITH NANOCRYSTALLINE OUTER SURFACE

CROSS-REFERENCE TO RELATED APPLICATION

The present application claims priority from provisional application Ser. No. 61/137,045, filed Jul. 24, 2008, the contents of which are incorporated herein by reference in their entirety.

TECHNICAL FIELD

Embodiments of the present invention relate to nanowires, and in particular, to nanowires that can be configured as light-emitting diodes or configured as light-detection devices.

BACKGROUND

Various nanowire-based devices have emerged in recent years with many potentially useful applications. Nanowires are wire-like structures that typically have diameters of less that about 100 nanometers and can be used as an electrical interconnection between electronic devices. One method of forming nanowires is the vapor-liquid-solid (VLS) chemical synthesis process. Generally, this method involves depositing particles of a catalyst material such as gold or titanium on a surface of a structure on which it is desired to grow nanowires. The structure is placed in a chamber and heated to temperatures typically ranging between about 250° C. to about 1000° C. Precursor gasses including elements or compounds that will be used to form the nanowires are introduced into the chamber. The particles of the catalyst material cause the precursor gasses to at least partially decompose into their respective elements, some of which are transported on or through the particles of catalyst material and deposited on the underlying surface. As this process continues, nanowires grow with the catalyst particle remaining on the tip or end of the nanowires. Nanowires can also be formed by physical vapor deposition or by surface atom migration.

When the elements or compounds selected to form the nanowires are varied within the nanowire, these nanowires are referred to as "heterostructure nanowires." In particular, a nanowire having a composition that varies along the longitudinal length of the nanowire is referred to as a "longitudinal heterostructure nanowire," and a nanowire having a radially varying composition is referred to as "coaxial heterostructure nanowire." Different regions or segments of single-composition or heterostructure nanowires can also be doped with electron donating and electron accepting impurities to form various semiconductor devices within the nanowires, such as p-n, p-i-n, p-n-p, and n-p-n junctions that enable the nanowires to be used as diodes, field-effect transistors, or photonic devices.

However, implementing nanowires in devices that can be employed in a wide range of useful light-emitting and light-detecting devices remains a challenge.

SUMMARY

Embodiments of the present invention are directed to nanowire devices. In one embodiment, a nanowire device comprises a p-type semiconductor core, an intrinsic or lightly doped semiconductor region surrounding the core, and an n-type semiconductor outer region at least partially surrounding the intrinsic semiconductor region. The nanowire also includes nanocrystals disposed on the surface of the outer region, wherein the nanocrystals provide electron-conduction paths along the length of the nanowire and spaces between the nanocrystals allow light to penetrate and be emitted from the semiconductor regions.

In certain embodiments, the intrinsic region can be configured with a light-emitting region and the nanowire operated as a light-emitting diode when a forward bias voltage of an appropriate magnitude is applied to the nanowire. In other embodiments, the nanowire can be used to detect photons of light.

DETAILED DESCRIPTION

Embodiments of the present invention are directed to nanowire devices having concentric and differently doped coaxial regions and nanocrystals disposed on the outer surface. In certain embodiments, a nanowire device includes a light-emitting region (LER) and can be operated as a light-emitting diode (LED) or a light-emitting component of a laser, while in other embodiments, a nanowire device can be configured and operated as a light-detection device (LDD). The nanocrystals disposed on the outer surfaces provide electron-conduction paths and some nanocrystals are separated by spaces that increase the light emitting and light absorbing efficiency of the devices. In particular, the nanocrystals disposed on the outer surface of the nanowire devices configured as LEDs provide electron-conduction paths and the spaces between nanocrystals increase the emissive surface area to volume ratio over conventional LEDs of similar projected planar area. In addition, the nanocrystals disposed on the outer surface of the LDDs provide electron-conduction paths and the spaces between nanocrystals increase the surface area over which light can penetrate the inner regions of the LDDs.

The detailed description of the present invention is organized as follows. Various configurations and compositions of the nanowires are presented in a first subsection, the nanowires configured and operated as LEDs are presented in a second subsection, and the nanowires configured and operated as LDDs are presented in a third subsection.

I. Nanowires having Coaxial Doped Regions and Nanocrystals

Figure 1A:
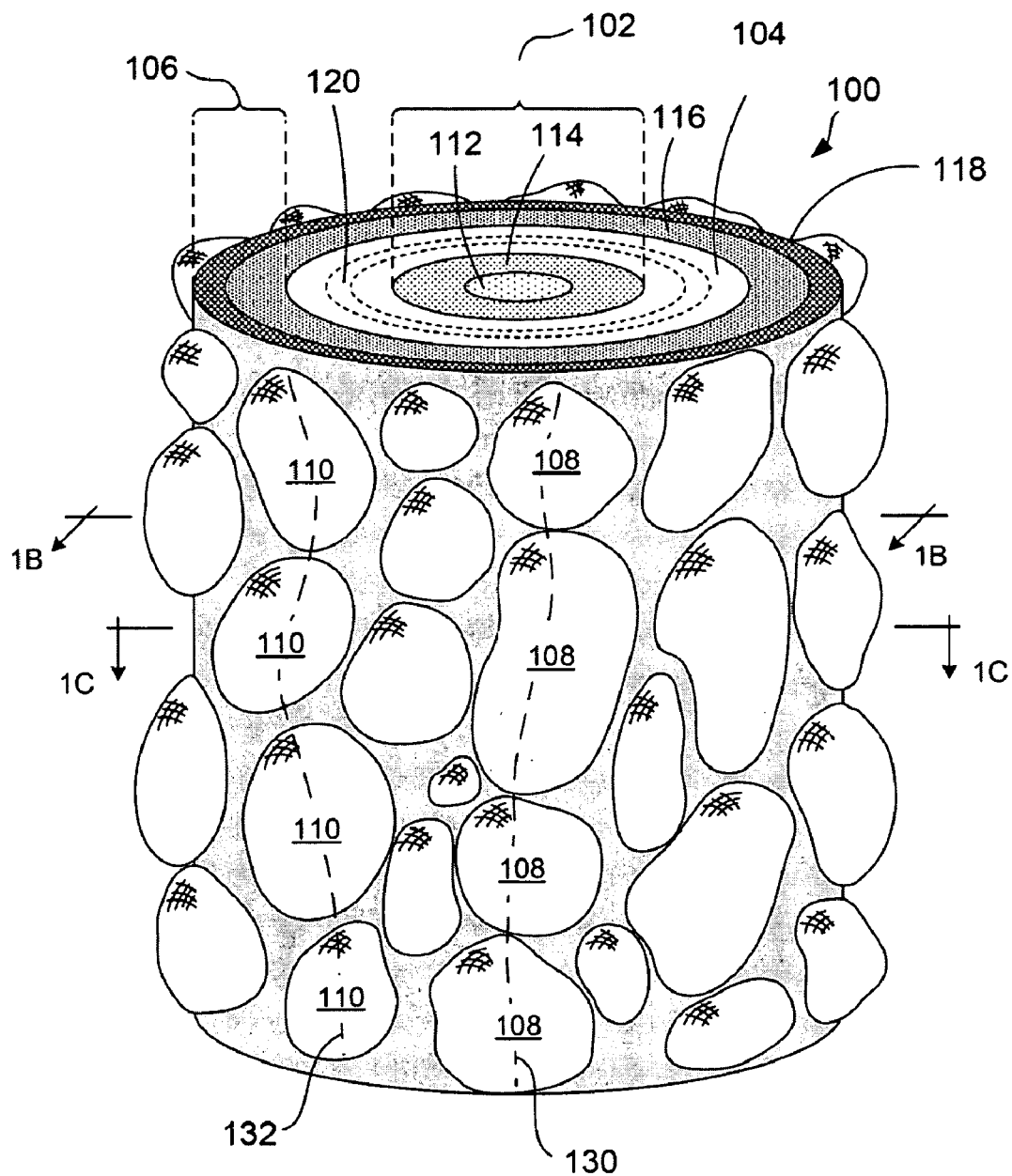
FIG. 1A shows an isometric view of a nanowire configured in accordance with embodiments of the present invention.

FIG. 1A shows an isometric view of a nanowire 100 configured in accordance with embodiments of the present invention. The nanowire 100 comprises a p-type semiconductor core 102 surrounded by an intermediate semiconductor region 104, which, in turn, is surrounded by an n-type semiconductor outer region 106. The p-type core 102, intrinsic region 104, and n-type region 106 are concentric coaxial regions that form a p-i-n junction diode. The nanowire 100 also includes nanocrystals, such as nanocrystals 108, disposed on the surface of the n-type region 106. As shown in FIG. 1A, the nanocrystals may be irregularly shaped, and a number of the nanocrystals are in direct physical contact, such as nanocrystals 108, while other nanocrystals are separated by spaces, such as nanocrystals 110.

The regions 102, 104, and 106 of the nanowire 100 can be composed of various combinations of direct and indirect semiconductors depending on how the nanowire 100 is employed A direct semiconductor is characterized by the valence band maximum and the conduction band minimum occurring at the same wavenumber. As a result, an electron in the conduction band recombines with a hole in the valence band giving off the energy difference as a photon of light. In contrast, indirect semiconductors are characterized by the valence band maximum and the conduction band minimum occurring at different wavenumbers. An electron in the conduction band minimum recombines with a hole in the valence band maximum by first undergoing a momentum change followed by a change in electronic energy.

The indirect and direct semiconductors used to form the regions 102, 104, and 106 can be elemental and compound semiconductors. Indirect elemental semiconductors include silicon (Si) and germanium (Ge), and compound semiconductors include III-V materials, where Roman numerals III and V represent elements in the IIIa and Va columns of the Periodic Table of the Elements. Compound semiconductors can be composed of column IIIa elements, such as aluminum (Al), gallium (Ga), and indium (In), in combination with column Va elements, such as nitrogen (N), phosphorus (P), arsenic (As), and antimony (Sb). Compound semiconductors can also be further classified according to the relative quantities of III and V elements. For example, binary semiconductor compounds include GaAs, InP, InAs, and GaP; ternary compound semiconductors include $GaAs_yP_{1-y}$, where y ranges from greater than 0 to less than 1 and quaternary compound semiconductors include $In_xGa_{1-x}As_yP_{1-y}$, where both x and y independently range from greater than 0 to less than 1. Other types of suitable compound semiconductors include II-VI materials, where II and VI represent elements in the IIb and VIa columns of the periodic table. For example, CdSe, ZnSe, ZnS, and ZnO are examples of binary II-VI compound semiconductors.

In certain embodiments, all three regions 102, 104, and 106 can be composed of the same semiconductor and the nanowire 100 is said to have a "homostructure," while in other embodiments, the regions 102, 104, and 106 can be composed of combinations of two or more different semiconductors and the nanowire 100 is said to have a "heterostructure."

Figure 1B:
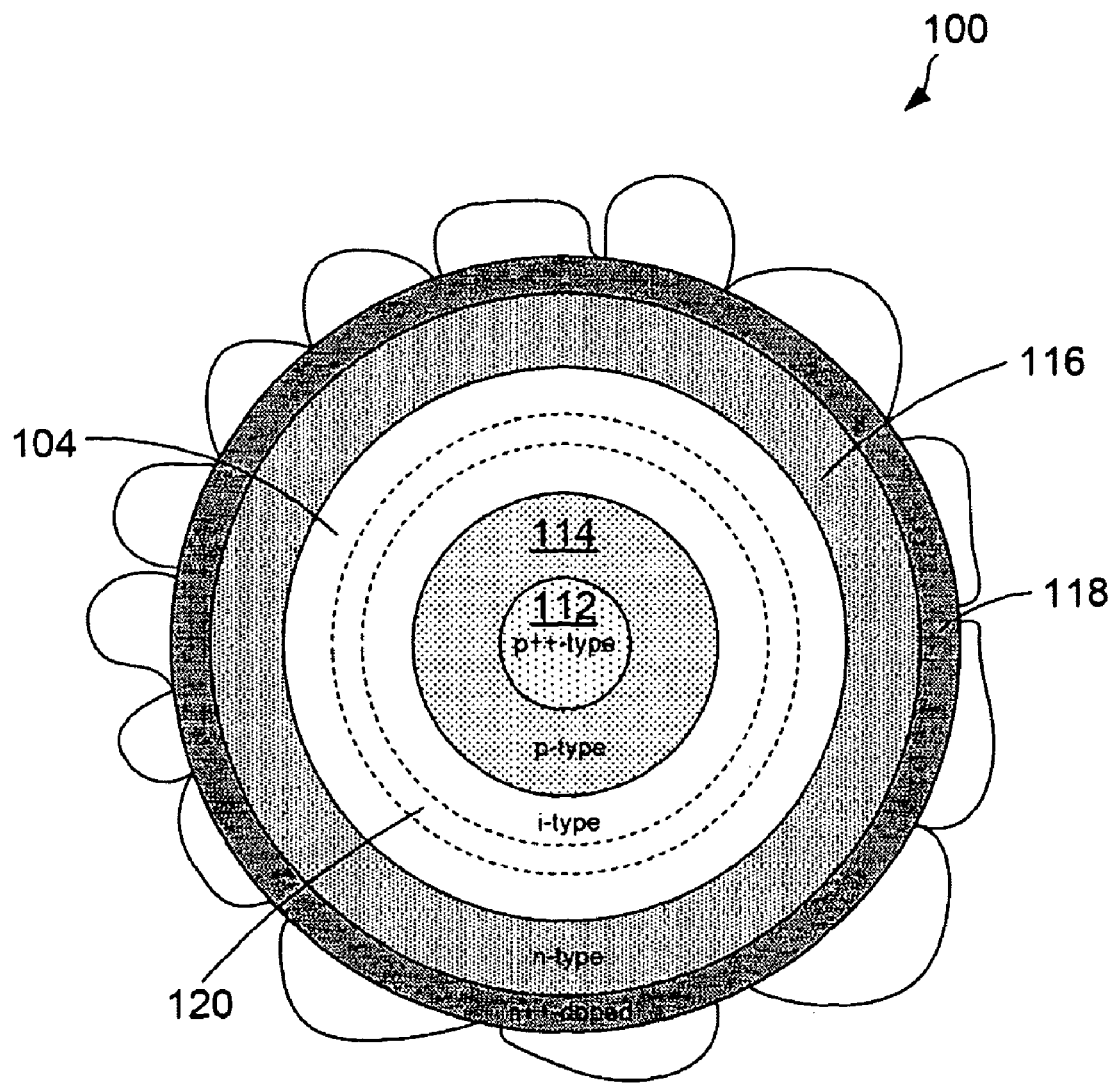
FIG. 1B shows a radial cross-sectional view of the nanowire along a line 1B-1B, shown in FIG. 1A, configured in accordance with embodiments of the present invention.

FIG. 1B shows a radial cross-sectional view of the nanowire 100 along a line 1B-1B, shown in FIG. 1A, in accordance with embodiments of the present invention. FIGS. 1A-1B reveal that the extrinsic p-type semiconductor core 102 and the n-type semiconductor outer region 106 are each composed of two concentric sub-regions, where each sub-region has a different dopant concentration. In certain embodiments, the intermediate region 104 can be composed of intrinsic semiconductor, and in other embodiments, the intermediate region 104 can be composed of lightly doped p-type or n-type semiconductor. In certain embodiments, the p-type semiconductor core 102 is composed of a $p^{++}$-type (i.e., heavily doped p-type) semiconductor inner core 112 and a moderately doped p-type semiconductor region 114 surrounding the inner core 112. The n-type semiconductor outer region 106 is composed of a moderately doped n-type semiconductor region 116 surrounding the intermediate region 104 and may include an $n^{++}$-type (i.e., heavily doped n-type) semiconductor region 118 surrounding the region 116. Note that when the $n^{++}$-type region 116 is accumulated by a work function difference, the heavily doped $n^{++}$-type region 118 may not be needed. Thus, in other embodiments, the n-type region 116 alone can be used to make an ohmic contact with the nanocrystals, as described below. In other embodiments, the p-type semiconductor region 114 and the n-type semiconductor region 116 can be excluded. In other words, the core 102 can be composed of a $p^{++}$-type semiconductor and the outer region 106 can be composed of an $n^{++}$-type semiconductor.

FIGS. 1A-1B also reveal a light-emitting region (LER) 120 located within the intermediate region 104. The LER 120 may be included to improve light emitting efficiency when the nanowire 100 is operated as an LED, as described below in the second subsection. Otherwise, the light-emitting region 120 is excluded from the intermediate region 104 when the nanowire 100 is operated as an LDD, as described below in the third subsection. Depending on how the nanowire 100 is used, the regions 112, 114, 104, 116, and 118 can be composed of different combinations of two or more different semiconductors and/or differently doped semiconductors.

The p-type impurities used to form the sub-regions 112 and 114 are atoms that introduce vacant electronic energy levels called "holes" to the electronic band gaps of these regions. These impurities are also called "electron acceptors." The n-type impurities used to form the sub-regions 116 and 118 are atoms that introduce filled electronic energy levels to the electronic band gap of these regions. These impurities are called "electron donors." For example, boron (B), Al, and Ga are p-type impurities that introduce vacant electronic energy levels near the valence band of Si; and P, As, and Sb are n-type impurities that introduce filled electronic energy levels near the conduction band of Si. In III-V compound semiconductors, column VI impurities substitute for column V sites in the III-V lattice and serve as n-type impurities, and column II impurities substitute for column III atoms in the III-V lattice to form p-type impurities. The moderately doped p-type region 114 and n-type region 116 can have impurity concentrations in excess of about $10^{15}$ impurities/$cm^3$ while the more heavily doped $p^{++}$-type region 112 and $n^{++}$-type region 118 can have impurity concentrations in excess of about $10^{19}$ impurities/$cm^3$.

Figure 1C:
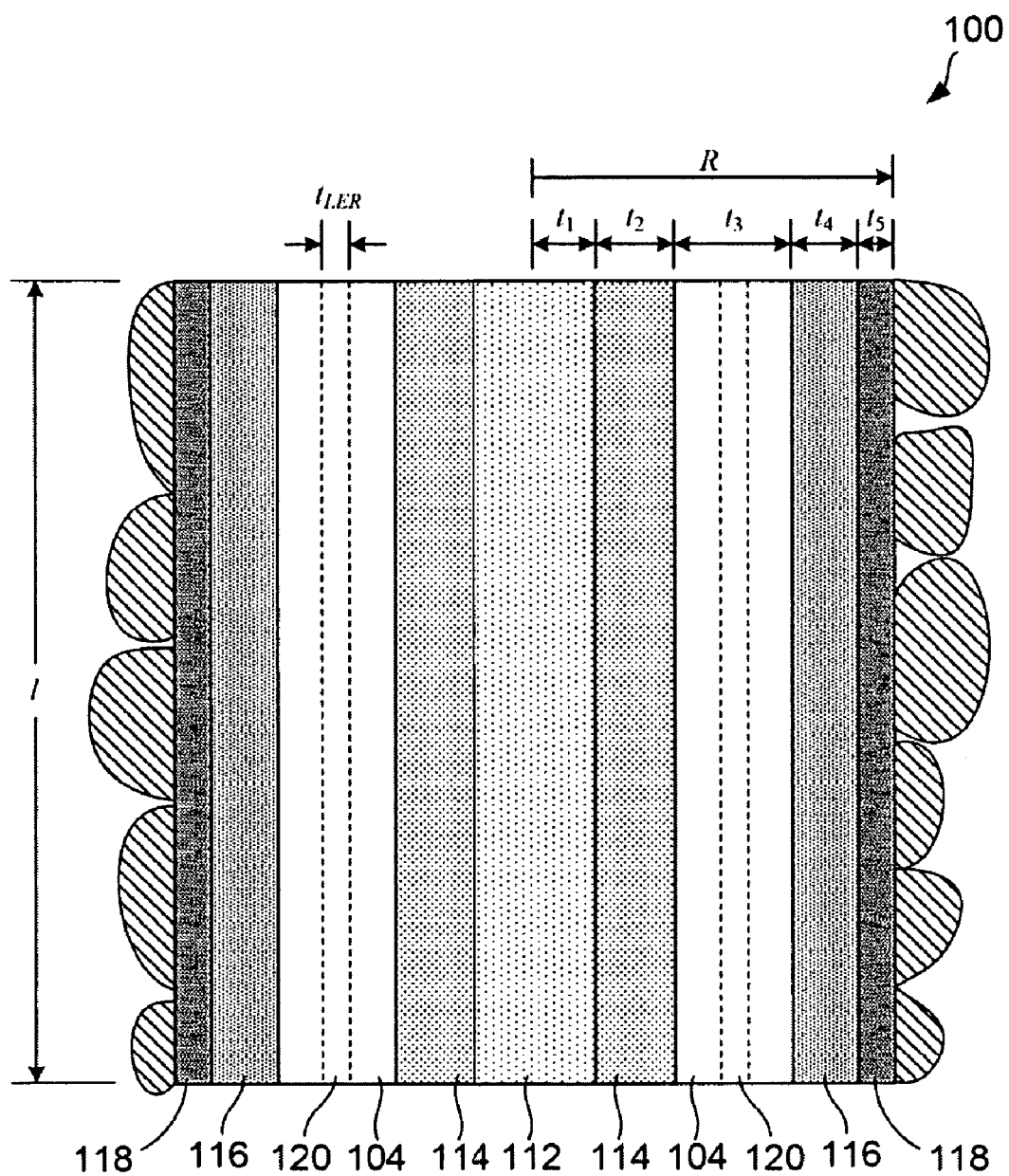
FIG. 1C shows a longitudinal cross-sectional view of the nanowire along a line 1C-1C, shown in FIG. 1A, in accordance with embodiments of the present invention.

The diameter and length of the nanowire 100 can also vary depending on the particular application. FIG. 1C shows a longitudinal cross-sectional view of the nanowire 100 along a line 1C-1C, shown in FIG. 1A, in accordance with embodiments of the present invention. Each region may have substantially uniform thickness along the length l of the nanowire 100. The length l can range from about 500 nm to about 20 microns. In FIG. 1C, the radial thicknesses of the regions 112, 114, 104, 116, and 118 are identified by the parameters $t_1$, $t_2$, $t_3$, $t_4$, and $t_5$, and the radial thickness of the optional LER 120 is identified by $t_{LER}$. The radius denoted by R of the nanowire 100 can range from about 80 to about 200 nm, and approximate radial thickness ranges of the regions 112, 114, 104, 116, 118, and 120 are provided in Table I as follows (although a wider range is possible in other embodiments):

TABLE I

| Parameter | Radial thickness |
|---|---|
| $t_1$ | 10-30 nm |
| $t_2$ | 10-30 nm |
| $t_3$ | 20-60 nm |
| $t_4$ | 10-30 nm |
| $t_5$ | 10-30 nm |
| $t_{LER}$ | 5-20 nm |

Returning to FIG. 1A, the nanocrystals disposed on the surface of the outer region 118 can be composed of gold, silver, copper, aluminum, or another suitable conducting material. The nanocrystals provide electron-conduction paths that substantially run the length of the nanowire 100. For example, touching nanocrystals 108 provide an electron-conduction path identified by dashed-line 130. Separation distances between nanocrystals of about 5 nm or less enable electrons to tunnel between neighboring nanocrystals also creating electron-conduction paths. For example, nanocrystals 110 may provide an electron-conduction path whereby electrons tunnel between neighboring nanocrystals creating an electron-conduction path that runs the approximate length of the nanowire 100 identified by dashed-line 132.

II. Nanowire Light-Emitting Diodes

Figure 2:
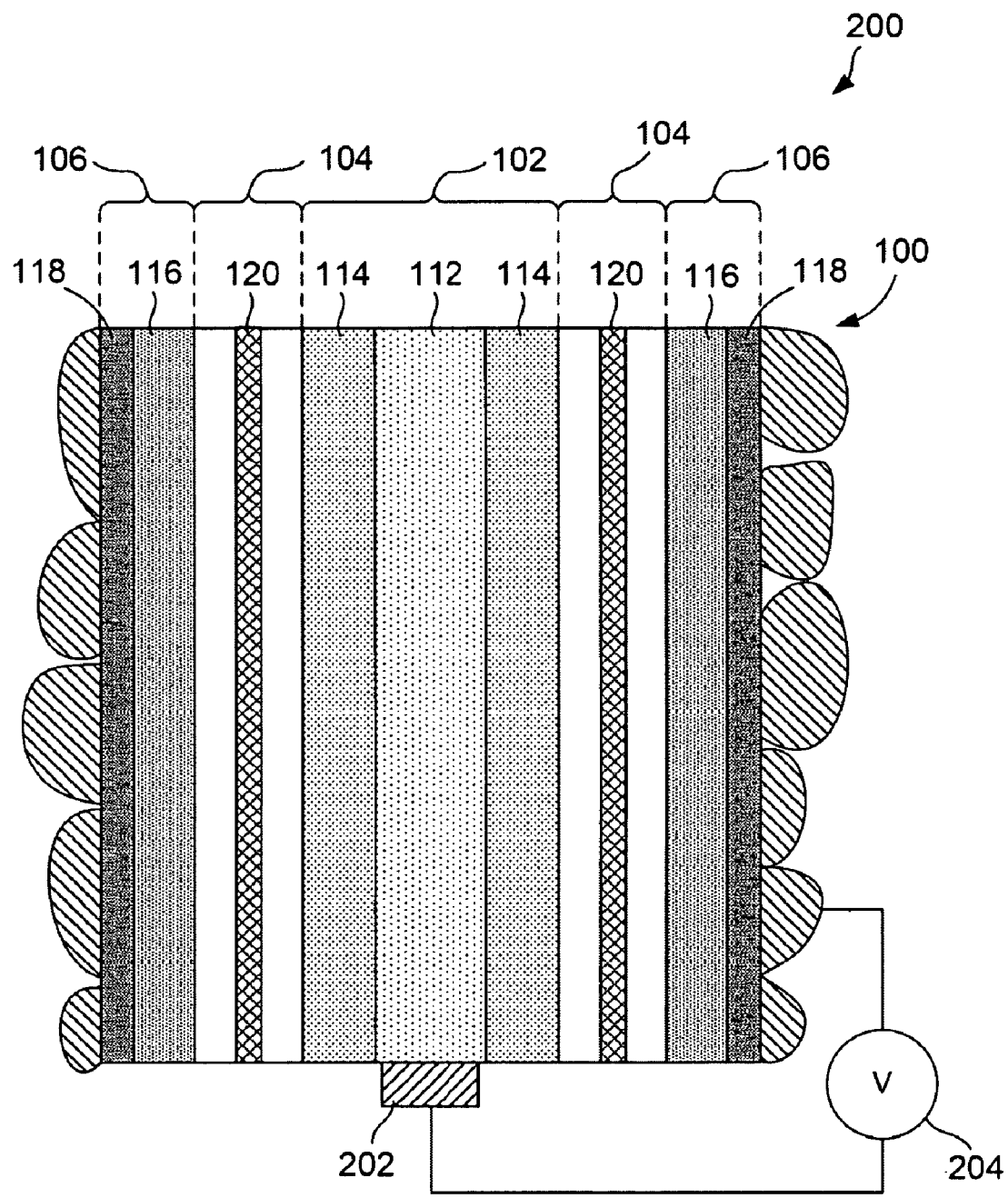
FIG. 2 shows a longitudinal cross-sectional view of a light-emitting diode configured in accordance with embodiments of the present invention.

FIG. 2 shows a cross-sectional view of an LED 200 configured in accordance with embodiments of the present invention. The LED 200 includes the nanowire 100 described above, an electrode 202 disposed on the surface of the inner core 112, and a voltage source 204 in electrical communication with the electrode 202 and the nanocrystals disposed on the outer surface of the nanowire 100.

As shown in FIG. 2, the intermediate region 104 includes the LER 120. The LER 120 may include one or more concentric cylindrical quantum wells (QWs) that substantially run the length l of the nanowire 100. The semiconductor materials selected for the region 102, portions of the region 104 outside of the quantum wells, and region 106 have relatively larger electronic band gap energies than the quantum wells. For example, in certain embodiments, the QWs of the LER 120 can be composed of intrinsic GaAs, which has a band gap of approximately 1.43 eV, while spacer layers (not shown), separating two or more QWs, and the regions 102, 104, and 106 can be composed of $Al_xGaAs_{1-x}$, where x ranges from 0 to 1, and the corresponding band gap energies range from approximately 1.43 eV to 2.16 eV. In other embodiments, the QWs of the LER 102 can be composed of intrinsic InAs, which has a band gap of approximately 0.36 eV, while the spacer layers separating the two or more QWs, and the regions 102, 104, and 106 can be composed of $In_{1-x}Ga_xAs$, where x ranges from greater than 0 to less than 1, and the corresponding band gap energies range from approximately 0.36 eV to 1.43 eV. Note that the LER 120 is optional and may only be included to enhance the light emitting efficiency of the LED 200.

Figure 3:
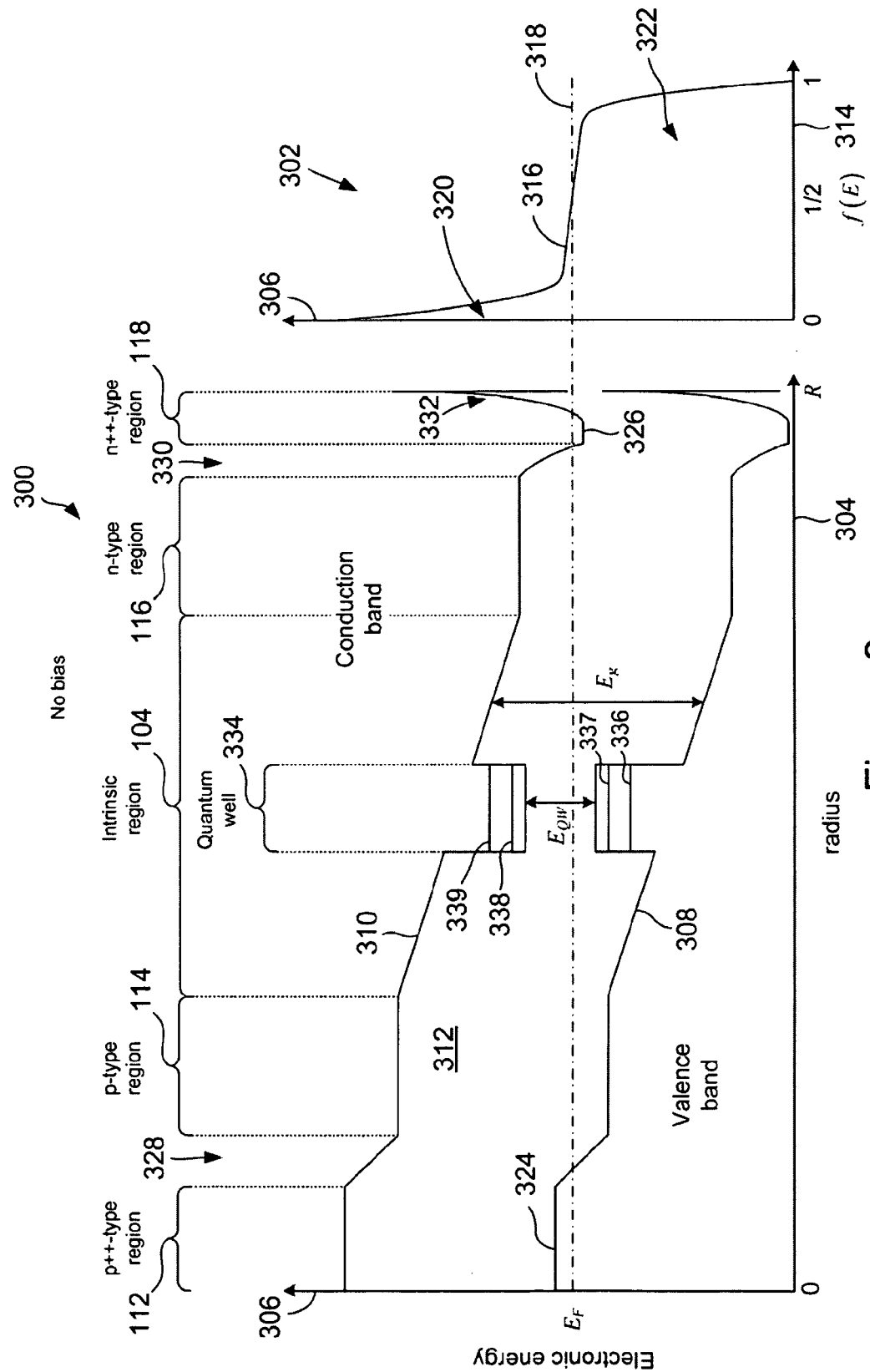
FIG. 3 shows an electronic energy band diagram and a corresponding Fermi-Dirac probability distribution associated with the light-emitting diode shown in FIG. 2 under zero bias in accordance with embodiments of the present invention.

FIG. 3 shows an electronic energy-band diagram 300 and a corresponding plot 302 of a Fermi-Dirac probability distribution associated with the LED 200 under zero bias in accordance with embodiments of the present invention. The band diagram 300 includes a horizontal axis 304 corresponding to the radius R of the nanowire 100 and a vertical axis 306 representing the electronic energy. The band diagram 300 includes a curve 308 representing the valence band edge of the nanowire 100 and a curve 310 representing the conduction band edge of the nanowire 100. The region 312 between the valence band edge 308 and the conduction band edge 310 are energies associated with the different sub-regions of the nanowire 100 for which no accessible electronic energy levels exist.

The plot 302 includes the vertical electronic energy axis 306 and a horizontal axis 314 representing probabilities ranging from 0 to 1. Curve 316 represents the Fermi-Dirac probability distribution, which is mathematically represented by:

$$f(E) = \frac{1}{1 + \exp[(E - E_F)/kT]}$$

where E represents the electronic energy of an electron, $E_F$ is the Fermi level represented in FIG. 3 by a dash-dot-line 318, k represents Boltzmann's constant, and T represents the absolute temperature of the device 800. The distribution f(E) 316 represents the probability that an electronic energy level is occupied by an electron at a particular absolute temperature T. The narrow area 320 between the energy axis 306 and the distribution f(E) 316 indicates that there is a low probably that the energy levels in the conduction band above the Fermi level 318 are occupied by electrons, and broad area 322 between the energy axis 306 and the distribution f(E) 316 indicates that there is a low probability that the energy levels in the valence band below the Fermi level 318 are empty. The general shape of the distribution f(E) 316 reveals that the likelihood of electrons occupying the energy levels above the Fermi level $E_F$ 318 decreases away from the Fermi level $E_F$ 318 and the likelihood of electrons occupying the energy levels below the Fermi level $E_F$ 318 increases away from the Fermi level $E_F$ 318.

The sub-regions 112, 114, 104, 116, and 118 of the nanowire 100 are also identified in the band diagram 300. A portion 324 of the valence band edge 308 associated with the heavily doped $p^{++}$-type region 112 lies near or above the Fermi level 318. According to the distribution f(E) 316, the energy levels between the portion 324 and the Fermi level 318 are mostly empty energy levels. In other words, these energy levels are mostly filled with holes. In contrast, a portion 326 of the conduction band edge 310 associated with the heavily doped $n^{++}$-type region 118 is near or may dip below the Fermi level 318. According to the distribution f(E) 316, the energy levels between the portion 326 and the Fermi level 318 are energy levels that are mostly filled with electrons.

The negatively sloped conduction and valence band edges associated with the intermediate region 104 and the space-charge regions 328 and 330 result from the potential difference between the neighboring sub-regions. In particular, the negatively sloped conduction and valence bands of the intermediate region 104 are the result of a potential difference between the neighboring p-type region 114 and the n-type region 116, the negatively sloped conduction and valence bands of the space-charge region 328 are the result of the potential difference between the neighboring p++-type region 112 and the p-type region 114, and the negatively sloped conduction and valence bands of the space-charge region 330 are the result of the potential difference between the neighboring n-type region 116 and the n++-type region 118. These negatively sloped conduction and valence bands are an equilibrium condition at zero bias and represent potential energy barriers that prevent electrons from flowing from the outer sub-regions into neighboring inner sub-regions.

A region 332 formed between the heavily doped n++-type region 118 and an adjacent nanocrystal (not represented) may be a depletion region. Because the region 118 has a high n++-type dopant concentration, the potential energy barrier is very narrow and is represented by a positively sloped, very narrow, depletion region at the surface of the semiconductor adjacent to the nanocrystal. Because this barrier is very thin, carriers can readily tunnel through the barrier, and the barrier can serve as an "ohmic contact." Provided the barrier width of the region 332 is on the order of about 3 nm or less, electrons can readily tunnel through the barrier between the n++-type region 118 and an adjacent nanocrystal. Note that in other embodiments the region 332 is not a depletion region. Instead the region 332 of the n++-type region 118 is slightly accumulated and an ohmic contact can readily form.

The band diagram 300 also reveals a single QW 334 within the intermediate region 104 with the QW band gap $E_{QW}$ smaller than the band gap $E_g$ of the intermediate region 104. The regions outside the QW 334 all have a continuum of electronic energy levels in the valence and conduction bands; however, the QW 334 has discrete energy levels, such as energy levels 336-339, that form as a result of quantum-mechanical confinement. According to the distribution f(E) 316, at zero bias, the energy levels 336 and 337 are likely filled with electrons and the energy levels 338 and 339 are likely unfilled.

Figure 4:
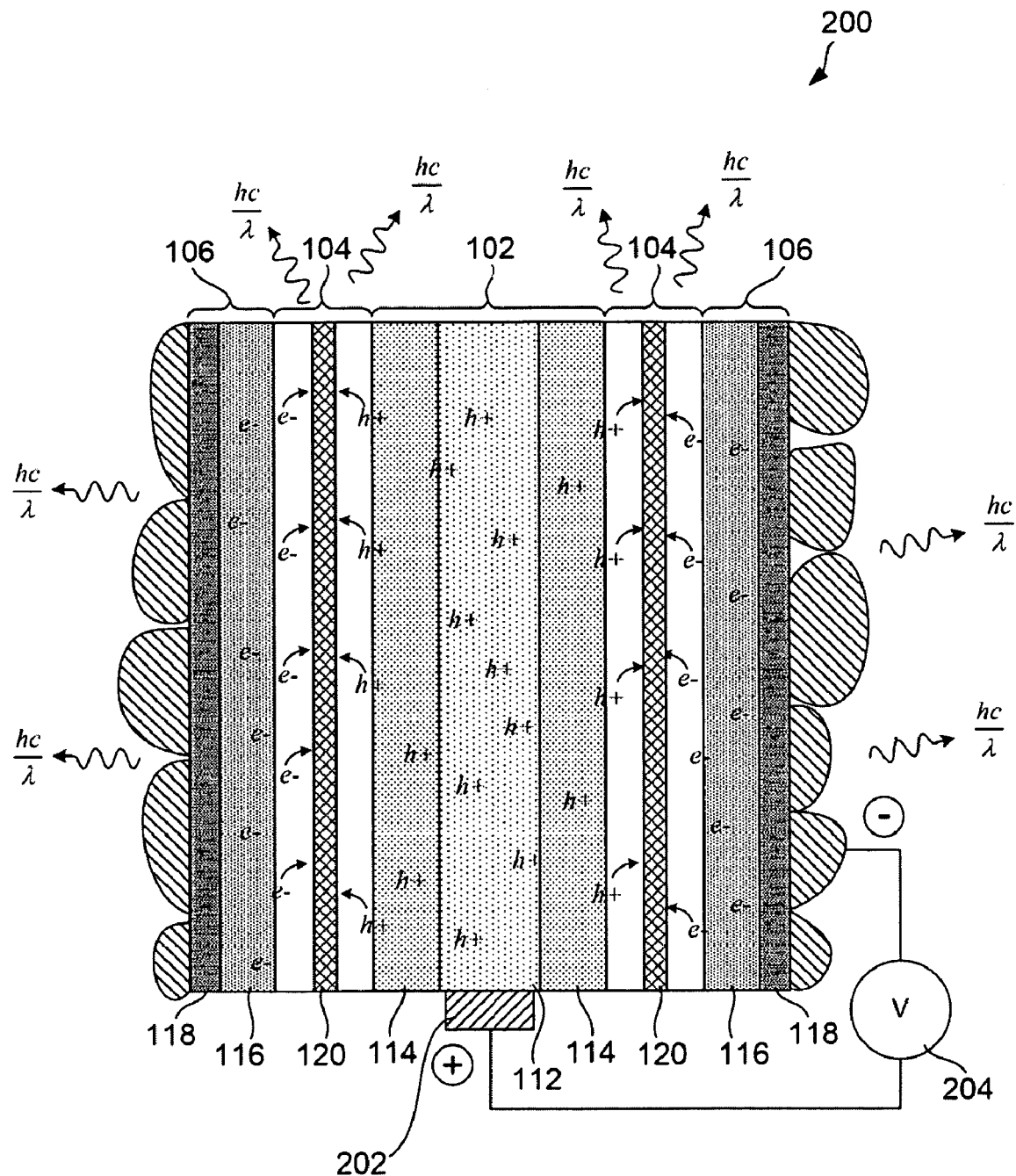
FIG. 4 shows a longitudinal cross-sectional view of the light-emitting diode shown in FIG. 2 under a forward bias in accordance with embodiments of the present invention.

FIG. 4 shows a longitudinal cross-section view of the LED 200 under a forward bias in accordance with embodiments of the present invention. Under a forward bias, a positive voltage is applied to the electrode 202 and a negative voltage is applied to the nanocrystals. The nanocrystals provide electron-conduction paths that, as described above with reference to FIG. 1A, facilitate the spread and propagation of electrons over the outer surface of the nanowire 100. As shown in FIG. 4, the electrons, denoted by e–, are injected through the nanocrystals into the n-type region 106, and holes, denoted by h+, are injected into the nanowire inner core 112 at the electrode 202 then into the subregion 104 through the p-type region 114. FIG. 4 provides a snapshot of holes and electrons migrating into the intermediate region 104 where the electrons spontaneously combine with holes in the LER 120 and emit photons of light with energy hc/λ and wavelength λ. Because of the space between the nanocrystals, light can be emitted in nearly all directions.

Figure 5:
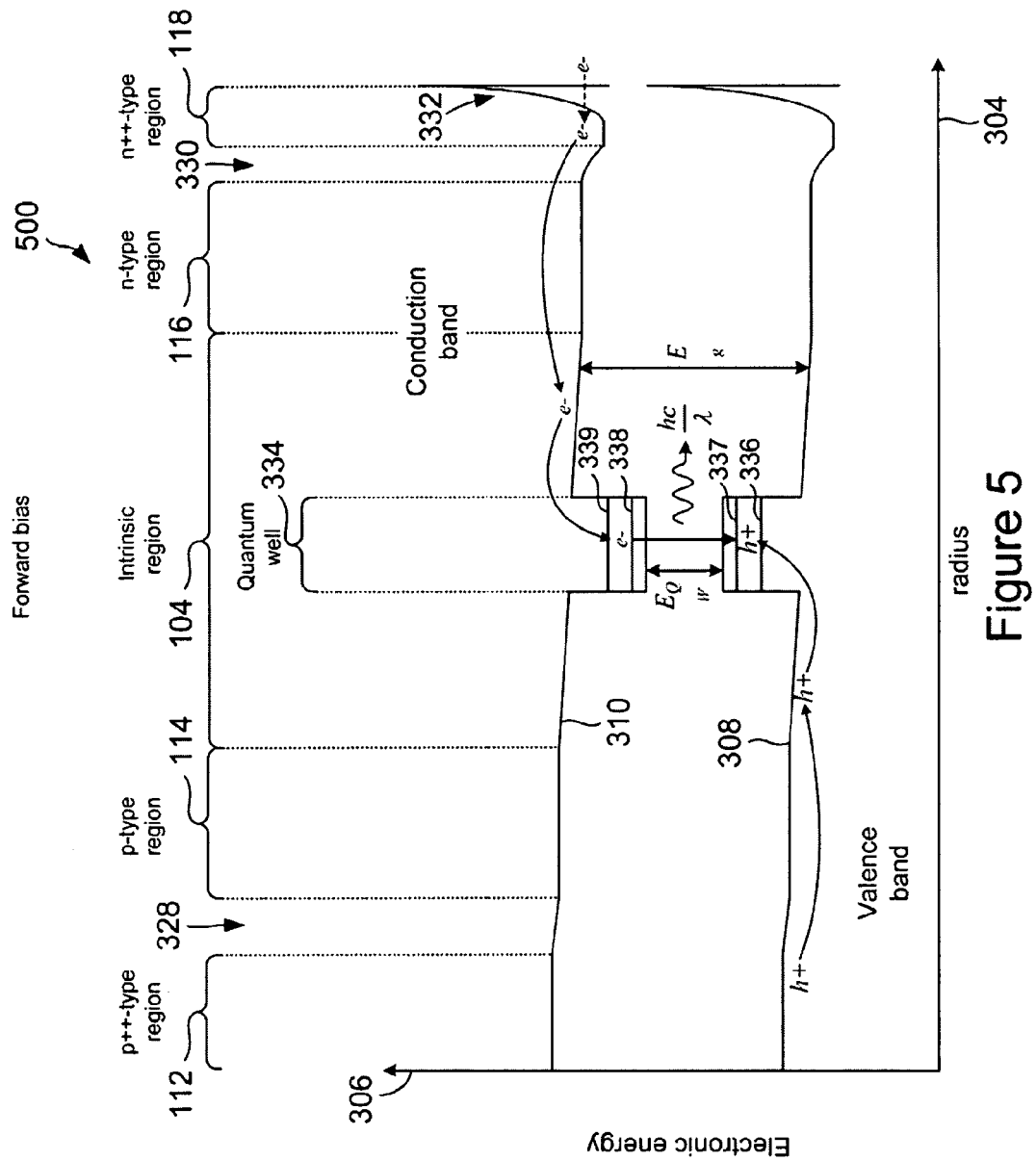
FIG. 5 shows an electronic energy band diagram associated with the light-emitting diode shown in FIG. 2 under a forward-bias in accordance with embodiments of the present invention.

FIG. 5 shows a band diagram 500 associated with the LED 200 under an applied forward-bias in accordance with embodiments of the present invention. Under a forward-bias, injected electrons tunnel through the narrow barrier of the region 332 into the conduction band, and holes are injected into the valence band of the p++-type region 112. Injecting electrons into the conduction band of the n-type regions 116 and 118 and injecting holes into the p-type regions 112 and 114 reduces or substantially eliminates the electric fields across the intermediate region 104. As a result, the steep negatively sloped potential energy barriers associated with the intermediate region 104 are lowered by comparison with the band diagram 300 shown in FIG. 3. Directional arrows indicate that electrons flow through the conduction band of the n-type sub-regions 116 and 118 into the quantized conduction band energy levels of the QW 334, while holes flow through the valence band of the p-type sub-regions 112 and 114 into the quantized valence band energy levels of the QW 334. As a result, there are high densities of electrons in the conduction band energy levels 338 and 339 and corresponding high densities of holes in the valence band energy levels 336 and 337. The relatively higher band gap energy $E_g$ of intermediate region 104 confines the injected carriers to the QW 334. As long as an appropriate voltage is applied in the same forward-bias direction, high densities of carriers are maintained in the QW 334, and, as shown in FIG. 5, electrons in the conduction band energy levels 338 and 339 spontaneously recombine with holes in the valence band energy level 336 and 337 emitting photons with energies and wavelengths λ satisfying the condition:

$$E_g > \frac{hc}{\lambda} \geq E_{QW}$$

where h is Plank's constant, and c is the speed of light in free space.

III. Nanowire Light-Detection Devices

Figure 6:
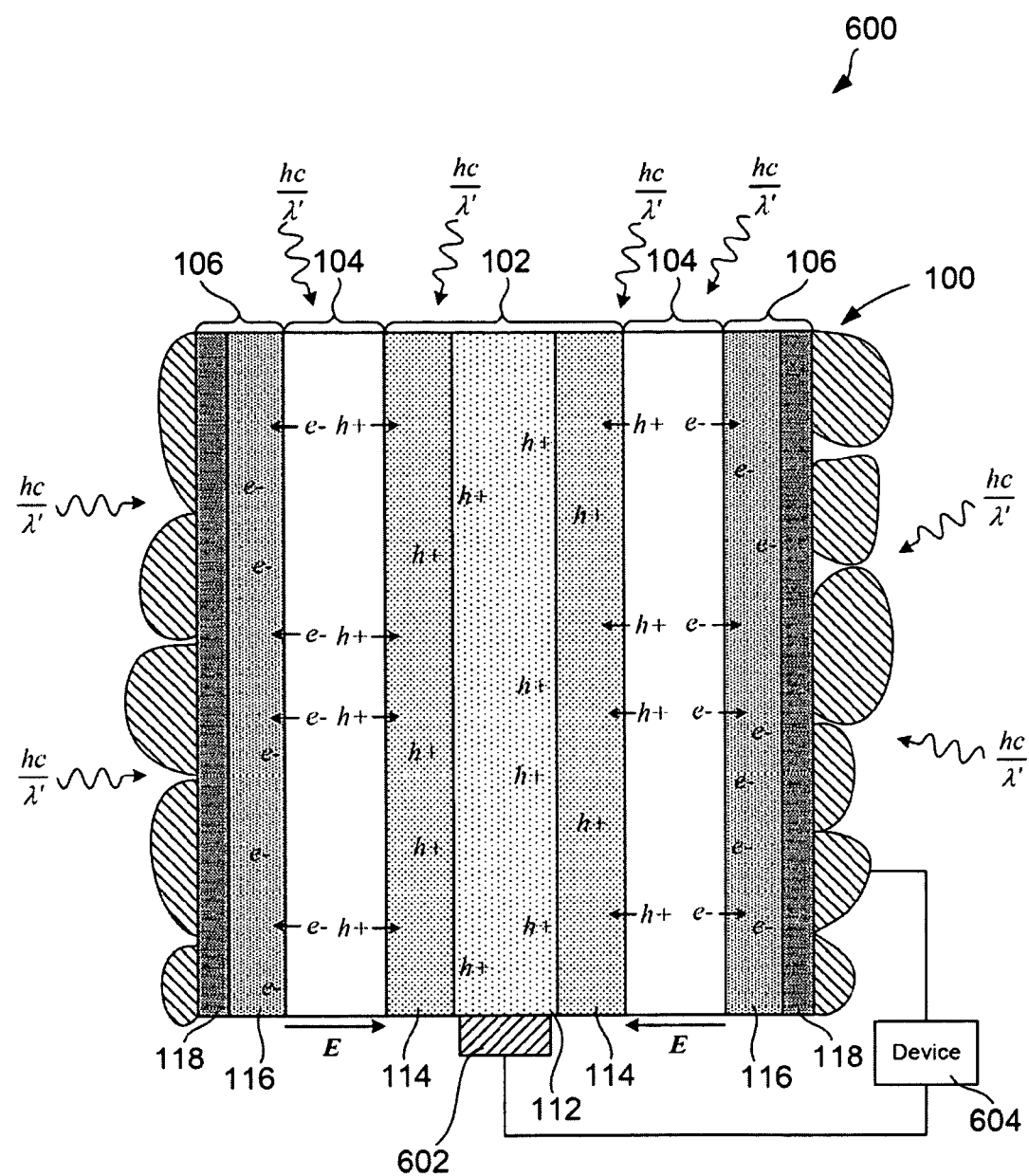
FIG. 6 shows a longitudinal cross-sectional view of a light-detecting device configured in accordance with embodiments of the present invention.

FIG. 6 shows a longitudinal cross-sectional view of an LDD 600 configured in accordance with embodiments of the present invention. The LDD 600 includes the nanowire 100, an electrode 602 disposed on the surface of the inner core 112, and a device 604 in electrical communication with the electrode 602 and the nanocrystals disposed on the outer surface of the nanowire 100. The device 604 can be a voltage meter, a current meter, a voltage source, a load, or any other device used to detect a photocurrent. Note that unlike the nanowire 100 of the LED 200, the nanowire 100 of LDD 600 does not include the LER 120 in the intermediate region 104.

As shown in FIG. 6, the potential difference between the n-type region 106 and the p-type region 102 creates an electric field E across the intermediate region 104. The electric field E is directed from the interface between the n-type region 116 and the intermediate region 104 to the interface between the p-type region 114 and the intermediate region 104. When light composed of photons having energies greater than the band gaps of at least one of the regions 102, 104, and 106 penetrates the nanowire 100, electron-hole pairs are created. The light can enter through the top of the nanowire and between the nanocrystals. The electric field E sweeps the electrons outward to the nanocrystals and sweeps the holes to the inner core 112 where the holes migrate to the electrode 602. The electrons entering the nanocrystals and holes entering the electrode 602 create a photocurrent that can be detected by the device 604. The nanocrystals facilitate the propagation of electrons to the device 604.

Figure 7:
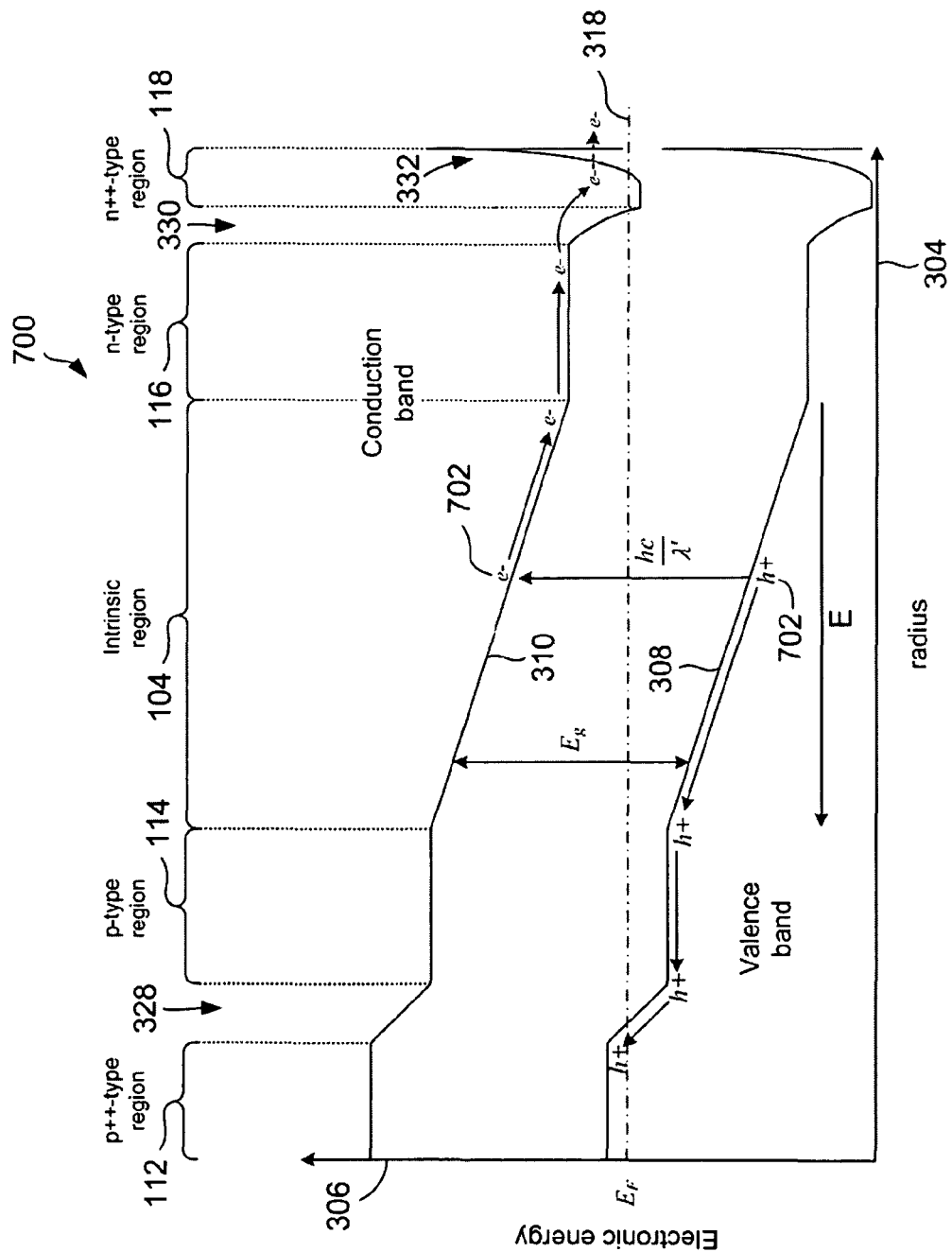
FIG. 7 shows an electronic energy band diagram associated with the light-detecting device shown in FIG. 6 in accordance with embodiments of the present invention.

FIG. 7 shows an electronic energy-band diagram 700 associated with the LDD 600 in accordance with embodiments of the present invention. The band diagram 700 is nearly identical to the band diagram 300 shown in FIG. 3 except the QW 334 is not represented. When photons of the light penetrate the regions of nanowire 100 with photonic energies satisfying:

$$\frac{hc}{\lambda'} \geq E_g$$

where h is Planck's constant and λ' is the wavelength of the photon, the photons are absorbed and electrons are excited from the valence band into the conduction band creating electron-hole pairs, such as electron-hole pair 702. The force of the electric field E across the intermediate region 104 sweeps electrons in the conduction band into the $n^{++}$-type region and through the narrow barrier of the region 332 (if present) into the nanocrystals, and the electric field E sweeps the holes into the $p^{++}$-type region 112. The electrons then pass through the device 604 where the electrons generate the desired electrical response.

The band diagram 700 represents the electronic band energies for a homostructured nanowire 100. As a result, the electronic band gap $E_g$ appears the same for all three regions 102, 104, and 106. In other embodiments, the nanowire 100 can be configured as a heterostructure with the regions 102, 104, and 106 composed of semiconductors having different band gap energies. In still other embodiments, the sub-regions 112, 114, 116, and 118 can be composed of different semiconductor materials having different band gaps.

The semiconductor materials selected for the nanowire 100 can also vary depending on the portion of the electromagnetic spectrum the LDD 600 is designed to detect. For example, CdS, a II-V compound semiconductor, is used to detect light in the visible portion of the electromagnetic spectrum, and elemental semiconductors such as Ge or a narrow band-gap III-V compound semiconductor such as InSb can be used to detect light extending into the infrared portion of the electromagnetic spectrum.

Ideally, the intermediate region 104 provides the light-absorption region of the LDD 600 and regions 102 and 106 have larger band gaps and are transparent to the incident light. The electron-hole pairs are generated by photons in the intermediate region 104, which has the highest electric field for sweeping out the charge carriers to create the photocurrent. Minority carriers of the electron-hole pairs generated in the regions 102 and 106 diffuse into the high electric field regions of the intermediate region 104, are swept across the intermediate region 104, collected and generate additional photocurrent. Occasionally, electron-hole pairs can recombine at defects and surface states before the pairs can be separated resulting in a decrease in efficiency of the LDD 600.

The nanowire structures described above with reference to FIGS. 1-6 are for a p-type semiconductor core 102 and an n-type semiconductor outer region 106. However, in other embodiments, an analogous nanowire having similar light-emitting and light-detecting properties and advantages can be fabricated with the core 102 comprising an n-type semiconductor and outer region 106 comprising a p-type semiconductor. In other embodiments, the inner core 112 can be composed of an $n^{++}$-type semiconductor surrounded by a moderately doped n-type semiconductor sub-region 114 and a moderately doped p-type semiconductor sub-region 116 surrounded by an optional $p^{++}$-type semiconductor sub-region 118. In still other embodiments, the core 102 can be composed of an $n^{++}$-type semiconductor and the outer region 106 can be composed of a $p^{++}$-type semiconductor.

The nanocrystals are typically smaller than the diameter of the nanowire and may be formed in several different ways. For example, nanocrystals may be formed by depositing a thin layer of metal on the nanowire and heating it to allow surface tension to cause agglomeration of the metal into small nanocrystals. The nanocrystals may be formed by electrochemical deposition from solution, or pre-formed nanoparticles may be added to the outer surface of the nanowire.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A nanowire (100) comprising:
   a semiconductor core (102) including one of p-type conductivity and n-type conductivity;
   an intermediate semiconductor region (104) surrounding the core including one of an intrinsic semiconductor material and a lightly doped semiconductor material;
   a semiconductor outer region (106) including the other of n-type conductivity and p-type conductivity at least partially surrounding the intermediate semiconductor region; and
   nanocrystals (108,110) disposed on the surface of the outer region, wherein the core, intrinsic region, and outer region are concentric and coaxial, and the nanocrystals provide electron-conduction paths along the length of the nanowire and spaces between the nanocrystals allow light to penetrate into and to be emitted from the semiconductor regions.

2. The nanowire of claim 1 wherein the semiconductor core (102) further comprises:
   a heavily doped p-type semiconductor inner core (112), and a moderately doped p-type semiconductor region (114) disposed between the inner core and the intermediate semiconductor region (104); or
   a heavily doped n-type semiconductor inner core and a moderately doped n-type semiconductor region disposed between the inner core and the intrinsic semiconductor region.

3. The nanowire of claim 1 wherein the semiconductor outer region further comprises:
   a moderately doped n-type semiconductor region (116) surrounding the intrinsic semiconductor region (104), and a heavily doped n-type semiconductor region (118) surrounding the moderately doped n-type semiconductor region (116); or
   a moderately doped p-type semiconductor region surrounding the intermediate semiconductor region, and a heavily doped p-type semiconductor region surrounding the moderately doped n-type semiconductor region.

4. The nanowire of claim 3 wherein the heavily doped semiconductor region adjacent to the nanocrystals is characterized by a narrow electronic potential barrier through which electrons tunnel between the heavily doped semiconductor and adjacent nanocrystals.

5. The nanowire of claim 1 wherein the nanocrystals further comprise one of:
gold;
silver;
copper;
aluminum; and
a suitable conductor material.

6. The nanowire of claim 1 wherein the electron-conduction paths further comprise nanocrystals separated by at most 5 nm.

7. The nanowire of claim 1 further comprising:
a length ranging from about 500 nm to about 20 microns; and
a diameter ranging from about 80 nm to about 200 nm.

8. A light-emitting diode (200) configured in accordance with claim 1.

9. The light-emitting diode of claim 8 further comprising an electrode (202) disposed on one end of the inner core (112).

10. The light-emitting diode of claim 8 further comprising a voltage source (204) coupled to the p-type semiconductor core and a portion of the nanocrystals and is configured to supply a forward bias voltage of an appropriate magnitude.

11. The light-emitting diode of claim 8 wherein the intermediate semiconductor region (104) further comprising a light-emitting region (120).

12. The light-emitting diode of claim 8 wherein when a forward bias voltage of an appropriate magnitude is applied, to the light-emitting diode, the light-emitting region (120) emits light from the ends of the nanowire and emits light that passes through the surface of the outer region between the nanocrystals.

13. A light-detection device (600) configured in accordance with claim 1.

14. The light-detection device of claim 13 further comprising a device (604) coupled to the semiconductor core and a portion of the nanocrystals, wherein the device detects a photocurrent generated by photons of light of an appropriate energy penetrating the intrinsic semiconductor region.

15. The light-detection device of claim 14 wherein the photons of light can pass through the spaces between the nanocrystals to penetrate the intrinsic semiconductor region.

* * * * *

UNITED STATES PATENT AND TRADEMARK OFFICE
CERTIFICATE OF CORRECTION

| | | |
|---|---|---|
| PATENT NO. | : 7,863,625 B2 | |
| APPLICATION NO. | : 12/242559 | |
| DATED | : January 4, 2011 | |
| INVENTOR(S) | : Alexandre Bratkovski et al. | |

It is certified that error appears in the above-identified patent and that said Letters Patent is hereby corrected as shown below:

In column 12, line 7, in Claim 12, delete "applied," and insert -- applied --, therefor.

Signed and Sealed this
Fourteenth Day of June, 2011

David J. Kappos
*Director of the United States Patent and Trademark Office*